United States Patent [19]

Smith

[11] Patent Number: 4,517,534

[45] Date of Patent: May 14, 1985

[54] CIRCUIT DETECTOR AND NOISE REDUCTION NETWORK WITH CIRCUIT DETECTOR

[75] Inventor: Stephen F. Smith, Knoxville, Tenn.

[73] Assignee: Alpha-Omega Engineering, Inc., Knoxville, Tenn.

[21] Appl. No.: 512,869

[22] Filed: Jul. 11, 1983

[51] Int. Cl.³ .................. H04B 1/64; H03G 7/00; H03K 5/153
[52] U.S. Cl. .................. 333/14; 307/264; 307/351; 307/358
[58] Field of Search .................. 333/14; 307/261, 264, 307/351, 355

[56] References Cited

U.S. PATENT DOCUMENTS 3,885,168  5/1975  Matsuzaki .................. 307/351
4,250,471  2/1981  Duncan .................. 333/14

Primary Examiner—Paul Gensler
Attorney, Agent, or Firm—W. Thad Adams, III

[57] ABSTRACT

Several circuit detectors and noise reduction networks with circuit detectors are disclosed. Detectors and networks according to the invention generally include a discharge diode placed within a feedback loop of an operational amplifier so that the hold time of the system is unaffected by the detector level. Circuits according to the invention may also include a conductor to provide a dynamically controlled charge and/or discharge path in combination with an active signal amplifying device.

24 Claims, 28 Drawing Figures

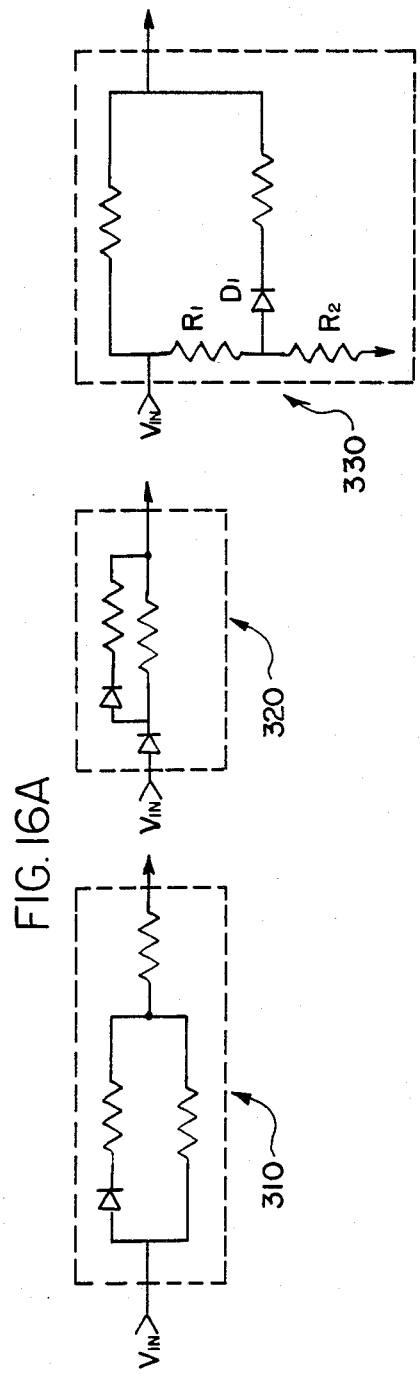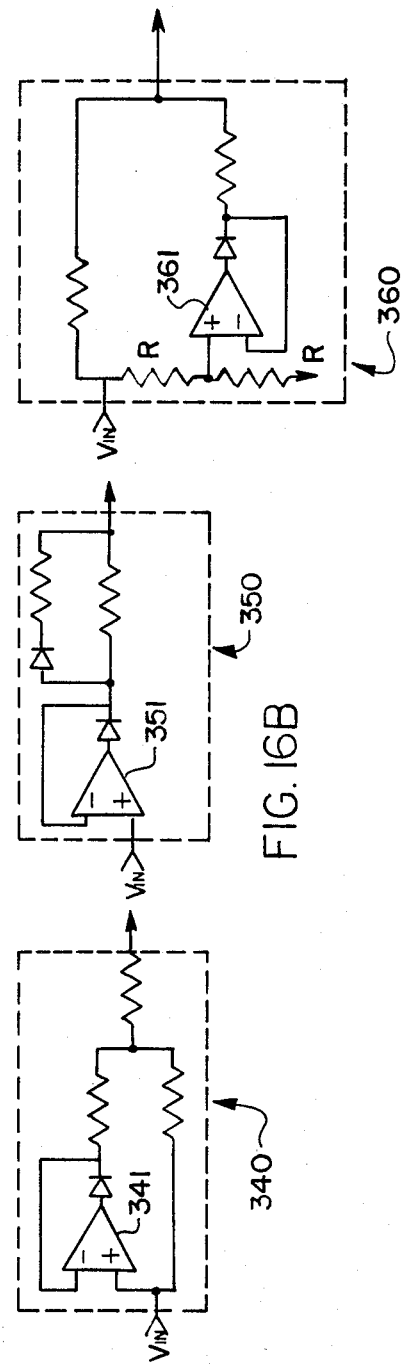
FIG. 16A
FIG. 16B

FROM t=0 to t=T1, V2 < V1
FROM t=t1 to t=∞, V2 > V1 (BY DIODE DROP)
(V2 IS THE DETECTOR OUTPUT VOLTAGE)

CIRCUIT DETECTOR AND NOISE REDUCTION NETWORK WITH CIRCUIT DETECTOR

TECHNICAL FIELD AND BACKGROUND OF THE INVENTION

This invention relates to electronic circuits of the general type used to process audio signals in order to effect a reduction in noise produced during recording and included in the signal, while not audibly degrading the portion of the signal intended for listening. While the various circuits disclosed in this application are useful in a wide variety of different types of noise reduction and related systems, one particular use for which it is intended is in connection with AM, FM and television audio recording, transmission and reception.

The circuits according to the invention disclosed in this application strike a scientifically valid and economically feasible balance which will permit early incorporation of noise reduction circuits in television equipment which will provide technically excellent results at reasonable cost.

In general, the invention relates to detectors which are suitable for use in compressors, expandors, compandors, limiters and other types of noise reduction systems. The circuit permits a faster basic attack time than known circuits. The circuit also delivers a higher detector output voltage by avoiding or minimizing output detector source voltage attenuation. In circuits according to the present invention, the discharge diode is placed within a feedback loop of the operational amplifier so that the hold time of the system is unaffected by the detector level.

The more specific disclosures of the present invention which follow should be read and understood in view of information concerning other types of noise reduction systems. For example, FIG. 1 of this application discloses a detector circuit commercialized in 1976 by Robert Orban and first applied in a limiter known as the "FM Optimod". FIG. 2 discloses a circuit of the general type disclosed in U.S. Pat. No. 4,250,471 granted on Feb. 10, 1981. Reference is also made to an extensive discussion contained under the heading "Discussion of the Prior Art" contained in columns 1 through 6 of the '471 patent. One basic difference between the Orban circuit and that disclosed in the '471 patent is that the latter includes a resistive voltage divider R4–R5 to provide a drive level for detector 2(D2) proportional to and less than the input signal. The hold function of the Orban circuit therefore varies greatly as a function of the amplitude of Vin.

SUMMARY OF THE INVENTION

Therefore, it is an object of the invention to provide a detector and detector circuit which permits a faster basic attack time than known circuits.

It is another object of the present invention to provide higher detector output voltage than known circuits by minimizing or eliminating output detection source voltage attenuation.

It is another object of the present invention to provide a circuit with a hold time which is unaffected by the level of the detector by, for example, placing discharge means within the feedback loop of an operational amplifier.

It is another object of the present invention to provide a detector circuit having first and second detectors which do not directly interact but in which the first detector provides a timing control to first disable and then activate and direct the operation of a discharge amplifier.

These and other objects and advantages of the present invention are achieved in the preferred embodiment of the method and apparatus below by providing a detector responsive to a primary input source signal for controlling the conversion of an AC signal to a DC voltage. The detector includes a first memory means for receiving input signals and a first directional conducting circuit for providing input signals to the first memory means. The first directional conducting circuit is connected between a primary input point and the first memory means and comprises a first unidirectional conductor in electrical parallel arrangement with a first resistive element. Second memory means are provided for continuously receiving and storing input signals. The second memory means includes an output point for providing an output signal representative of the stored signal value of the second memory means.

A second directional conductor provides input signals to the second memory means and is connected between a secondary input point and the second memory means and comprises a second unidirectional conductor in electrical parallel arrangement with a second resistive element.

The circuit also includes an active signal amplifying device and a third unidirectional conductor in electrical series arrangement to provide a dynamically controlled charge and/or discharge path for the second memory means which is dependent upon the instantaneous voltages on the first and second memory means. In the case of discharges, whenever the stored signal value of the first memory means is at least equal to a prescribed fraction of the stored signal value for the second memory means, the amplifying device produces an output signal such that the third unidirectional conductor does not conduct. Thus, the stored signal values of the first and second memory means are essentially independent of each other and vary substantially only in response to changes in the input signals provided to the first and second memory means, respectively, as they discharge according to their respective time constants. Whenever the primary electrical source signal is less than the stored value of the second memory means and the stored value of the first memory means decreases to a value substantially equal to the prescribed fraction of the stored value of the second memory means (which value is greater than the stored value of said first memory means) the amplifying device causes the third unidirectional conductor to conduct and the stored signal values of the first and second memory means vary in a nearly proportional manner and remain substantially proportional to each other by the ratio of the prescribed fraction as they both discharge according to a combined time constant which is essentially the same time constant of the first memory means. In the charging case, whenever the stored signal value of the first memory means is at most equal to the inverse of a prescribed fraction of the stored signal value of the second memory means, the amplifying device produces an output signal such that the voltage across the third unidirectional conductor is now reversed in orientation from the discharge case and the conductor, also reversed, does not conduct. Thus, the stored signal values of the first and second memory means are essentially independent of each other and vary substantially only in response to changes in the input signal provided to the first and second memory means, respectively, as they charge or discharge, according to the level of their respective time constants. Whenever the primary electrical source signal is greater than the stored value of the second memory means, the stored signal value of the first memory means increases to a value substantially equal to the inverse of the prescribed fraction of the stored value of the second memory means, which value is now less than the stored fraction of the first memory means by a ratio of the prescribed fraction. In such case, the amplifying device causes the third unidirectional conductor to conduct and the stored signal values of the first and second memory means vary in a nearly proportional manner and remain substantially proportional to each other by the ratio of the prescribed fraction as they both charge according to a combined time constant which is essentially the time constant of the first memory means.

In accordance with various embodiments of the present invention, single and multistage detectors are disclosed, as well as circuitry for compressing, expanding and companding the dynamic range of an electrical signal.

BRIEF DESCRIPTION OF THE DRAWINGS

Some of the objects of the invention have been set forth above. Other objects and advantages of the invention will appear as the description of the invention proceeds, when taken in conjunction with the following drawings, in which:

FIG. 8b is a detector having multiple-divider circuitry of the type shown in FIG. 7 and the independent attack and release control detectors shown in FIG. 8a;

FIG. 9b shows two alternate forms of unidirectional conductors, each using active circuitry in the form of an operational amplifier;

FIG. 15 is a dual circuit form of the detector shown in FIG. 8a;

FIG. 16a shows three alternate forms of a unidirectional conductor for variable attack-passive type;

FIG. 16b shows three alternate forms of unidirectional conductor for variable attack-active type;

DESCRIPTION OF THE PREFERRED EMBODIMENT

Before proceeding to the description of various preferred embodiments of this invention, further note will be made of certain prior examples of detectors over which the present invention constitues an improvement.

Figure 1:
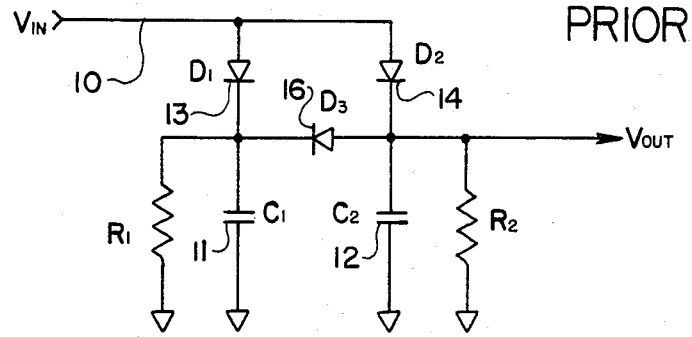
FIG. 1 is an example of the prior art commercialized by "Orban" in 1976.

Referring first to FIG. 1, an increasing input signal (voltage) at 10 causes capacitors 11 and 12 to charge up through diodes 13 and 14 respectively to the same voltage level. The time constant of detector 13 is considerably shorter than that of detector 14 so capacitor 11 discharges faster than capacitor 12 when the signal at Vin drops. After a relatively short hold time, the voltage across capacitor 11 drops to a level about 0.6 V below capacitor 12, causing a diode 16 to conduct and discharge capacitor 12 with a time constant much shorter than the time constant of detector 14. The hold time of this circuit varies greatly for a given variation in detector level.

Figure 2:
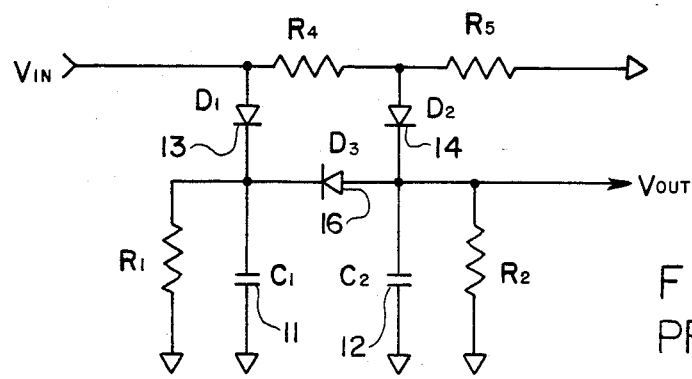
FIG. 2 is one embodiment of a general type disclosed in U.S. Pat. No. 4,250,471.

FIG. 2 illustrates a simplified version of the detector of the general type disclosed in U.S. Pat. No. 4,250,471. This circuit operates in a similar manner to that disclosed in FIG. 1. An increasing signal at Vin causes capacitor 11 to charge up to roughly the peak input level, but capacitor 12 is charged to a level only R5/(R4+R5) as high. As capacitor 11 discharges after a drop in Vin, the voltage across capacitor 12 decays much more slowly until the voltage on capacitor 11 drops to about 0.6 V below the level of capacitor 12, thus activating diode 16 and causing capacitor 12 to discharge at a much faster rate than before. The hold time of the circuit is roughly the same as the time constant of diode 13 and is substantially less sensitive to a variation in detector level than in the detector shown in FIG. 1, although at low levels the hold time does increase noticably.

Figure 3:
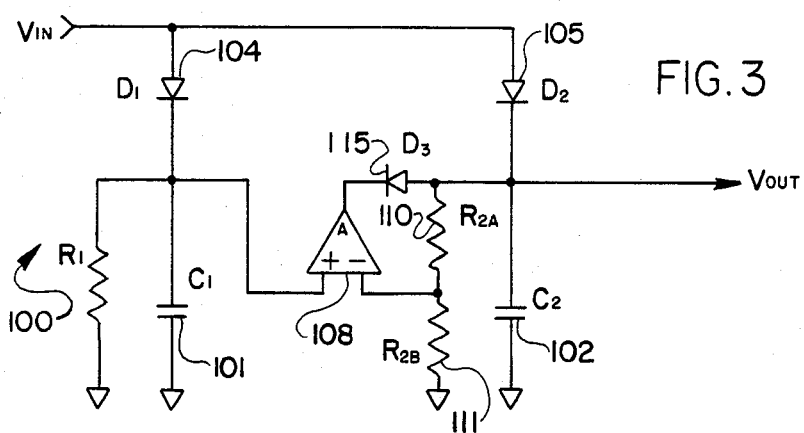
FIG. 3 is a detector, in peak-detecting form, with discharge control.

Now referring specifically to the drawings of various embodiments of the present invention, FIG. 3 is a basic embodiment of a detector according to the present invention, where control of the main detector capacitor discharge only is implemented. This circuit, broadly indicated at reference numeral 100, comprises a peak-sensitive detector in accordance with the present invention. The signal at Vin is assumed to be a positive direct current (DC) voltage corresponding to the alternating current (AC) signal being detected by the circuit 100. As Vin increases, capacitors 101 and 102 are charged to approximately the peak value of Vin through diodes 104 and 105, respectively. As in the circuits shown in FIGS. 1 and 2, the time constant of diode detector 104 is assumed to be much shorter than that of diode/detector 105. Operational amplifier 108 is an active device (typically a transistor circuit of discrete or integrated design). Operational amplifier 108 provides a very high input impedance in both inverting (−) and noninverting (+) inputs, very high DC and AC gain, and low output impedance. Basically, operational amplifier 108 compares the voltage across capacitor 101 and an attenuated version of the voltage across capacitor 102. The voltage at capacitor 102 is divided by resistors 110 and 111 (resistor 111 divided by the sum of resistors 110 and 111) so that the voltage thus divided is presented to the inverting input of operational amplifier 108. Resistors 110 and 111 also form a feedback network to control the gain of amplifier 108 in the discharge mode. If the voltage as divided by resistors 110 and 111 is positive, that is, greater than the voltage at capacitor 102, diode 115 will not conduct and capacitors 101 and 102 are free to discharge according to their respective time constants. However, when the voltage at the output of amplifier 108 drops more than 0.6 V below the voltage at capacitor 102, diode 115 is turned on and begins to discharge capacitor 102 into the output node of amplifier 108. The resistor 110-111 feedback network forces amplifier 108 to discharge just enough current from capacitor 102 to keep the voltage at capacitor 102 at a value equal to the resistance of resistor 111 divided by the sum of resistors 110 and 111, multiplied by the voltage at capacitor 101 until either or both capacitors 101 and 102 discharge to zero, or until the Vin increases again. The discharge time constant of capacitor 102 is thus held to precisely the value of the time constant of diode/detector 104.

This action is completely independent of the voltage drop across diode 115 and/or the detector voltage levels and represents a valuable and previously unattainable function, particularly for wide-range, high-accuracy operational requirements.

Figure 3A:
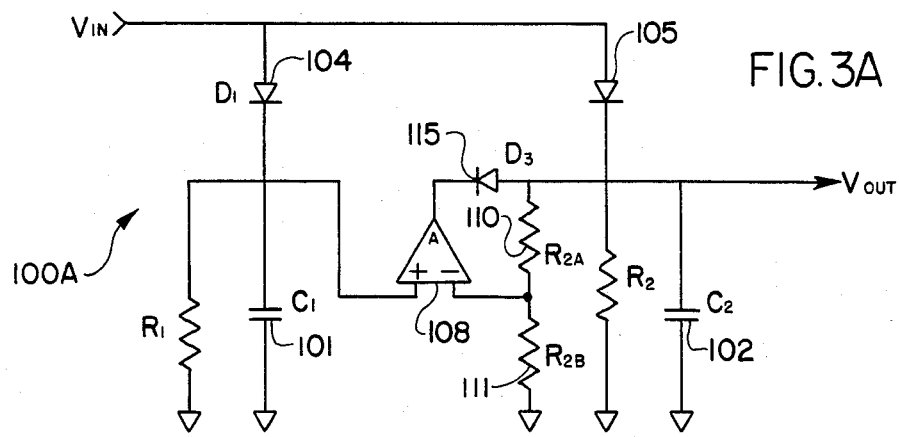
FIG. 3a is a detector according to FIG. 3, with a discharge diode placed outside the feedback loop of the circuit.

FIG. 3a illustrates the applicability of the detector shown in FIG. 3 to a circuit where discharge diode 115 is placed outside the amplifier feedback loop to permit slower attack and release times at lower detector voltage levels which might be present due to diode characteristics.

Figure 4:
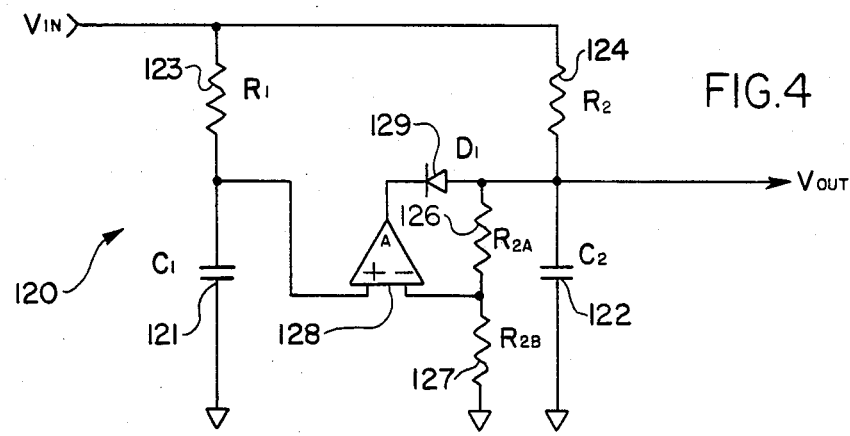
FIG. 4 is an average-detecting circuit, with discharge control.

FIG. 4 shows a basic averaging-type detector 120 in accordance with the present invention where capacitors 121 and 122 are charged and discharged, respectively, from Vin through resistors 123 and 124, respectively. As in FIG. 3, the detector time constants are chosen such that the time constant of resistor 123 and capacitor 121 is much less than the time constant of resistor 124 and capacitor 122. The voltage across capacitor 122 is attenuated by the voltage divider which is formed by a resistor 127 from resistor 126 in the circuit shown in FIG. 4. In consequence, the inverting input of operational amplifier 128 sees the voltage of capacitor 122 multiplied by the value of resistor 127 divided by the sum of resistors 126 and 127. The noninverting input of amplifier 128 is at the level of the voltage of capacitor 121. So long as the latter voltage is greater than the former as specified above, the output from amplifier 128 is positive and diode 129 does not conduct. Capacitors 121 and 122 discharge according to their respective time constants. Resistors 126 and 127 are assumed to be much larger in value than resistor 124 so that they do not significantly affect the charge or discharge rate associated with capacitor 122. When the voltage at capacitor 121 drops to the level at the inverting input of amplifier 128, the output of amplifier 128 drops below the level of the voltage at capacitor 122, thus turning on diode 129 thereby beginning discharge of capacitor 122 at the rate of the greater time constant (the product of resistor 123 and capacitor 121).

Figure 4A:
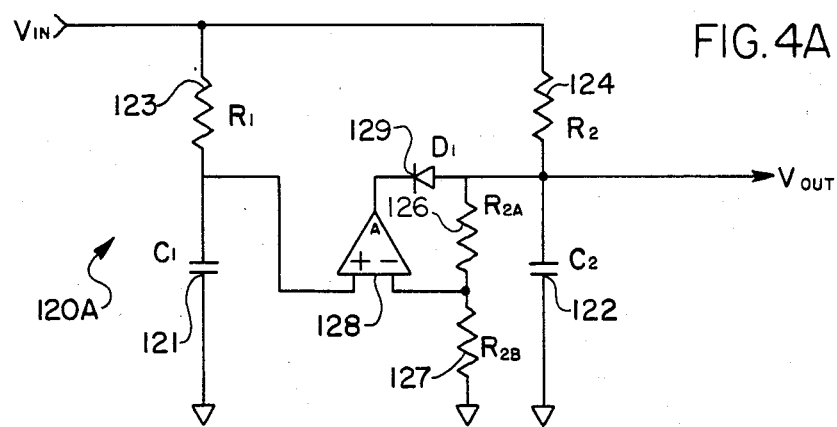
FIG. 4a is a circuit according to FIG. 4 with a charging diode placed outside the feedback loop of the circuits.

FIG. 4a shows a detector circuit 120a which varies from detector circuit 120 shown in FIG. 4, in that diode 129 is placed outside the feedback loop of amplifier 128 in order to permit slower attack and release times at lower detector voltage levels.

Figure 5:
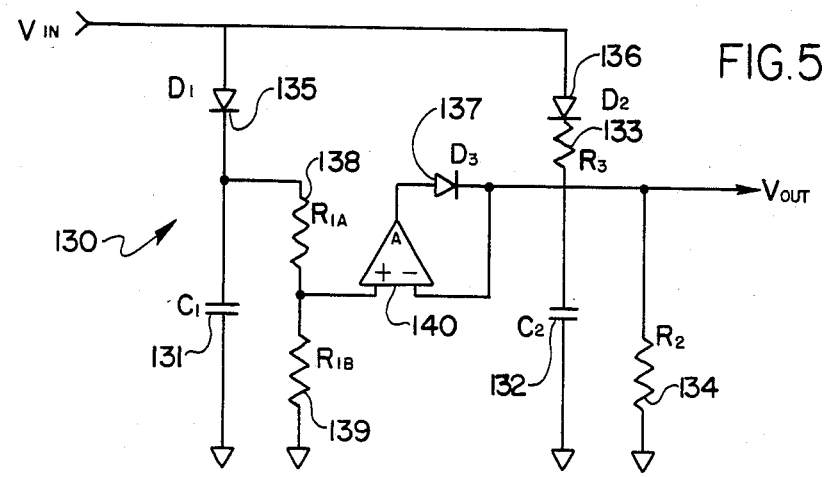
FIG. 5 is a detector of the peak-detecting form with charge control.

Referring now to FIG. 5, a detector circuit 130 is shown which comprises a basic peak detector which employs active control of the charging rate of a particular capacitor rather than of the discharge rate as illustrated in previous circuits. In circuit 130, the output is derived from capacitor 132 which charges with an approximate attack time constant of the product of resistor 133 and capacitor 132 (neglecting the normally small diode resistance). Capacitor 132 charges at a time constant approximately equal to the product of resistor 134 and capacitor 132 for slowly rising voltage signals into circuit 130. In circuit 130 the time constant of diode/detector 135 is approximately equal to the sum of resistors 138 and 139 multiplied by the value of capacitor 131. This time constant is chosen to be substantially smaller than the time constant of capacitor 132 so that as long as the rise time of input voltage is of the same order or less than the attack time of detector/diode 136, detector 135 will have no effect on the output voltage. If, however, the rise time of the input voltage is substantially shorter than the time constant of detector 136, then capacitor 131 will charge up much faster than capacitor 132 when the voltage $[R139/(R138+R139)]V_{c131}$ exceeds the instantaneous value of the voltage of the capacitor 132. The output of the operational amplifier 140 rises, causing diode 137 to conduct and charge up capacitor 132 to the instantaneous level of the formula recited immediately above. The net result is that if a transient voltage of capacitor 131 exceeds capacitor 132 by the ratio of $(R138+R139)/R139$ the amplifier 140 and diode 137 will speed up the attack time of detector 136 and of the output voltage.

This feature is very useful for audio gain-control devices where the control characteristics are generally very slow acting unless a loud transient occurs, in which case fast control action is required. This system permits small transients and sounds to pass through the system at essentially constant gain while maintaining appropriate control over fast, high level transients which might otherwise cause system overload.

This adaptive-attack feature may also be used with the corresponding discharge control circuit for even greater performance and esthetically pleasing sound quality when used in audio systems.

Figure 5A:
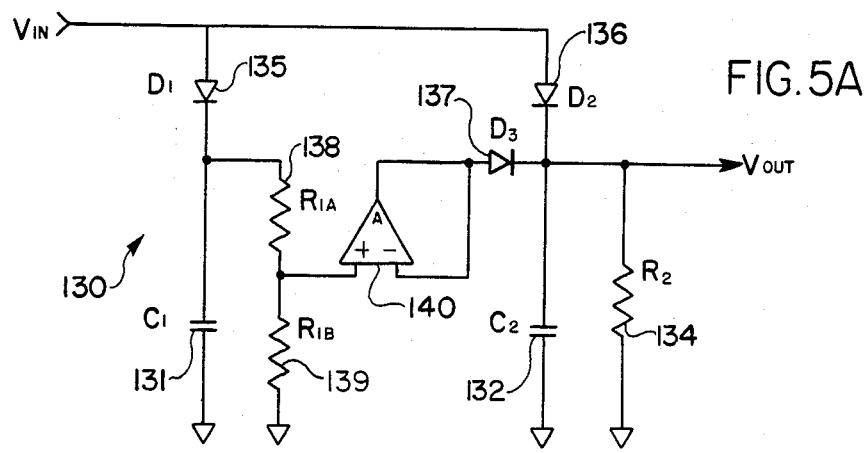
FIG. 5a is a circuit according to FIG. 5 with a discharge diode placed outside the feedback loop of the circuit.

FIG. 5a illustrates a detector 130a which differs from detector 130 in FIG. 5 in that the diode 137 is placed outside the feedback loop of amplifier 140 in order to permit slower attack and release times at lower detector voltage levels.

Figure 6:
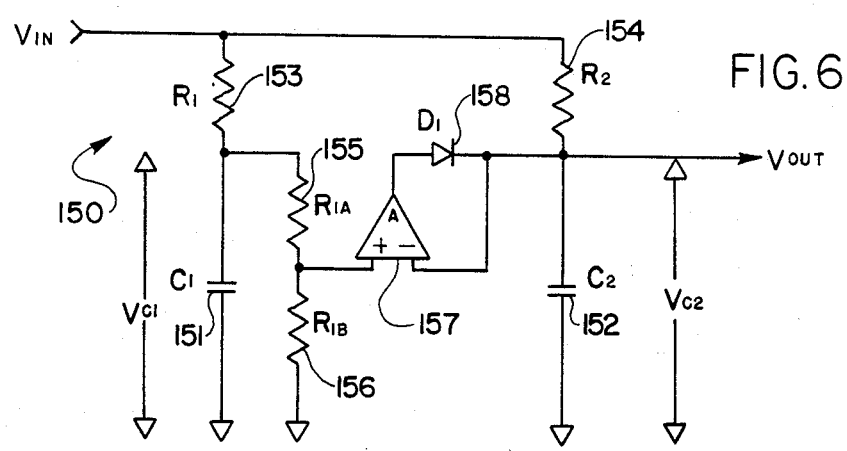
FIG. 6 is a detector of the average-detecting type, with charge control.

Referring now to FIG. 6, a detector circuit 150 is shown of the basic average-detecting form. Circuit 150 is analogous in many respects to circuit 130, shown in FIG. 5; however, the two detectors used are of the averaging type rather than the peak-detecting type as shown in FIG. 5. The operation of the circuit is the same as in FIG. 5 except that the averaging time constant of one detector is the product of resistor 153 and capacitor 151 and the time constant of the second detector is the product of resistor 154 and capacitor 152. These time constants specify both the intrinsic attack and release times of the two detectors. Resistors 155 and 156 are assumed to be much larger in value than resistor 153 so that their affect on the time constant of the first detector is negligible.

Figure 6A:
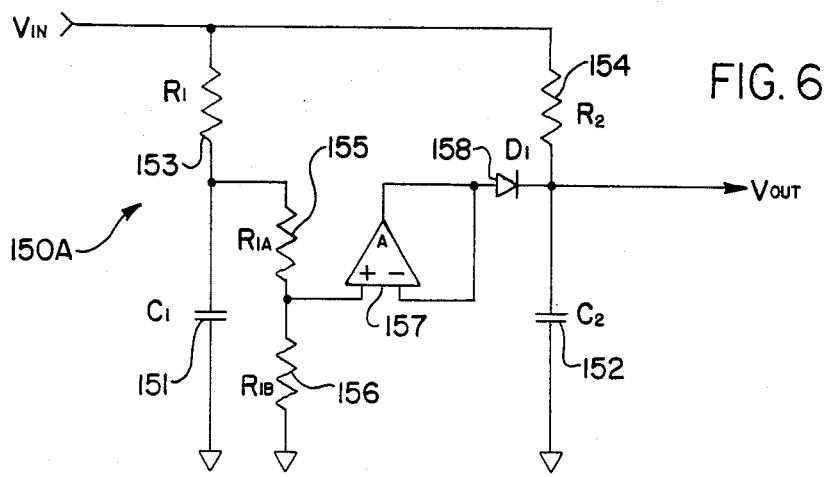
FIG. 6a is a detector according to FIG. 6 with a charging diode placed outside the feedback loop of the circuit.

FIG. 6a shows a detector circuit 150a which is similar to circuit 150 shown in FIG. 6 except diode 158 is placed outside the feedback loop of amplifier 157 in order to permit slower attack and release times at lower detector voltage levels.

Figure 7:
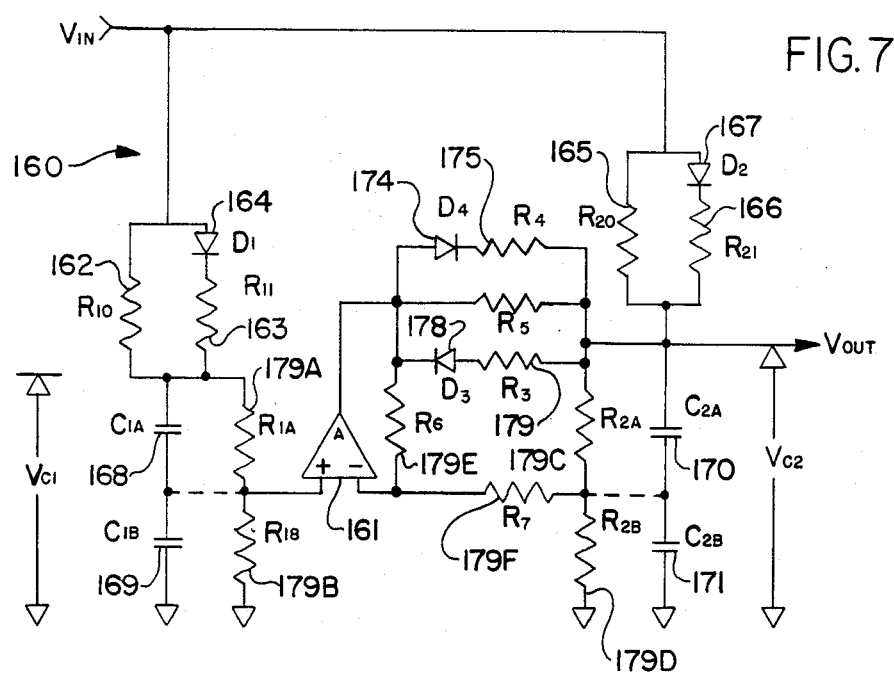
FIG. 7 is a detector according to the present invention with a common charge/discharge control.

FIG. 7 illustrates a detector circuit 160 of a more general form which employs a standard operational amplifier 161 to provide, depending upon component selection, either charging or discharging control of a second detector by comparing its voltage with the voltage developed by a first detector. The resistor-diode networks [(resistor 162, resistor 163 and diode 164) and (resistor 165, resistor 166 and diode 167)] provide charge/discharge paths to the detector storage capacitors 168, 169 and 170, 171, respectively. By allowing the resistances of resistor 162 and resistor 165 to approach infinity, the circuit degenerates to the peak-detector form. Permitting resistors 163 and 166 to increase to infinity while retaining moderate values for resistors 162 and 165 yields an averaging-type circuit. Selection of a network comprising diode 174 and resistor 175 at the output of operational amplifier 161 permits charge-control action, since diode 178 and resistor 179 are deleted. Retaining diode 178 and resistor 179 and removing diode 174 and resistor 175 provides the discharge-control configuration. Voltage division for the two detector signals is indicated by the input connections to amplifier 161 from the junctions of resistors 179a, 179b, 179c and 179d.

Resistors 179e and 179f may be used to limit the gain of amplifier 161 to provide more gradual transitions between operating modes than diodes alone would permit. Any of the previously described basic forms of the detector of this invention may be obtained by appropriate selection of parts values (including zero and infinity) in this general circuit and it will be apparent to those skilled in the art that these choices are made based upon a variety of conditions and criteria which change according to circumstances and therefore need not be recited in detail.

Figure 8A:
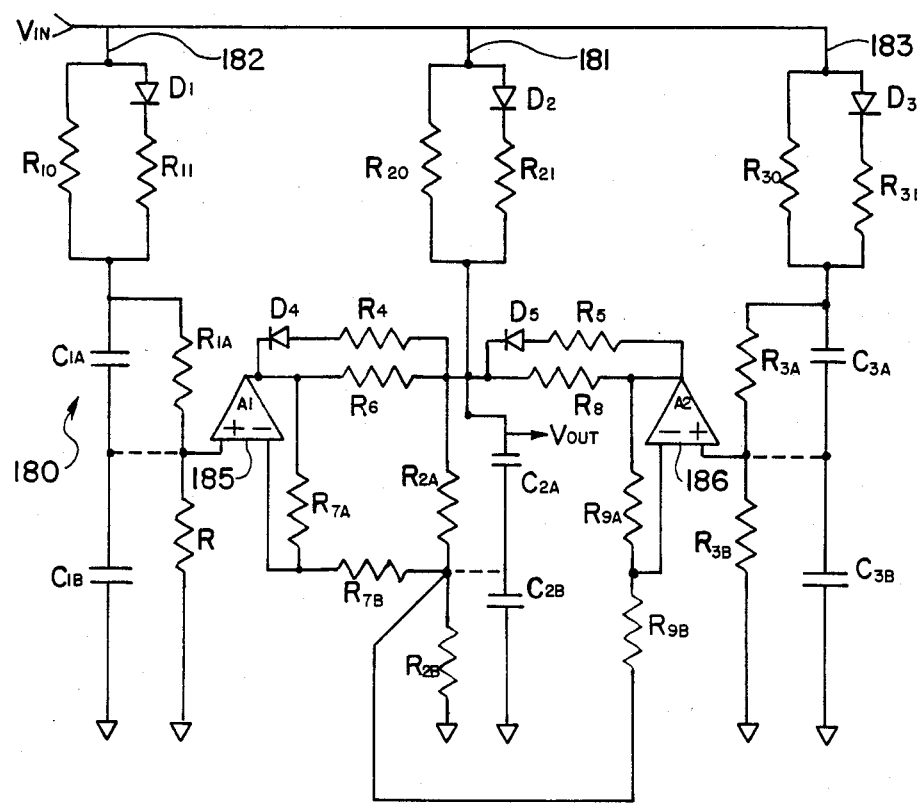
FIG. 8a is a detector according to the present invention with independent charge and discharge controls and with different time constants.

Referring now to FIG. 8a, a detector system 180 according to the present invention is shown which comprises a main detector 181, and two controlling detectors 182 and 183. Detector 182 is configured to provide discharge control and detector 183 handles the charging function. Circuit 180 provides for separate time constants and thresholds for the charging and discharging portions of the circuit, which is more typical of the needs of a high-quality detector for handling audio signals such as voice or music.

Figure 8B:
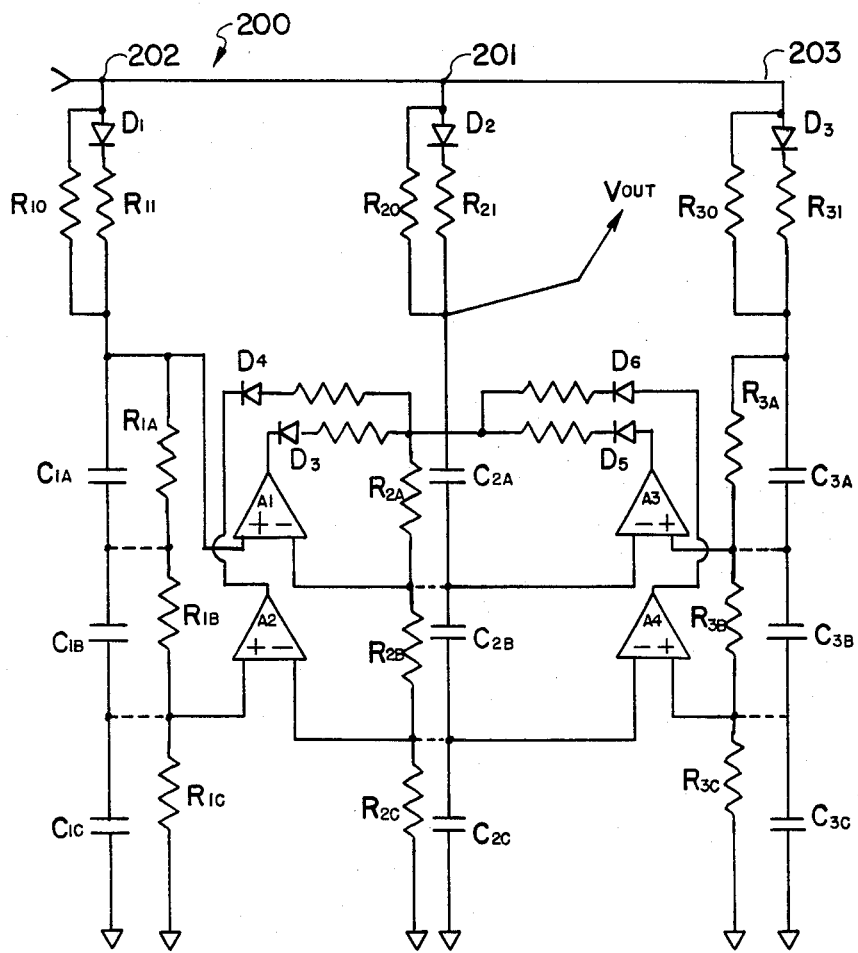

Referring now to FIG. 8b, a detector circuit 200 is shown which illustrates an extension of the multiple-divider concept shown in FIG. 7 and the independent attack and release control detectors of FIG. 8a. As in FIG. 8a, circuit 200 comprises a main detector 201 and two controlling detectors 202 and 203. Detector 202 is configured to provide discharge control whereas detector 203 handles the charging function. By reference to FIG. 8b, it is evident that any number of voltage division increments and/or any number of auxiliary detectors may be employed to tailor the composite detection response at the output voltage point.

Figure 9A:
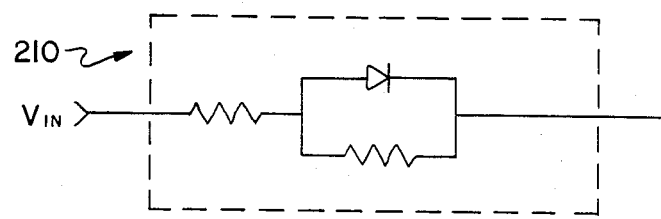
FIG. 9a illustrates an alternate form of unidirectional conductor of the type shown in FIG. 7.
Figure 9A:
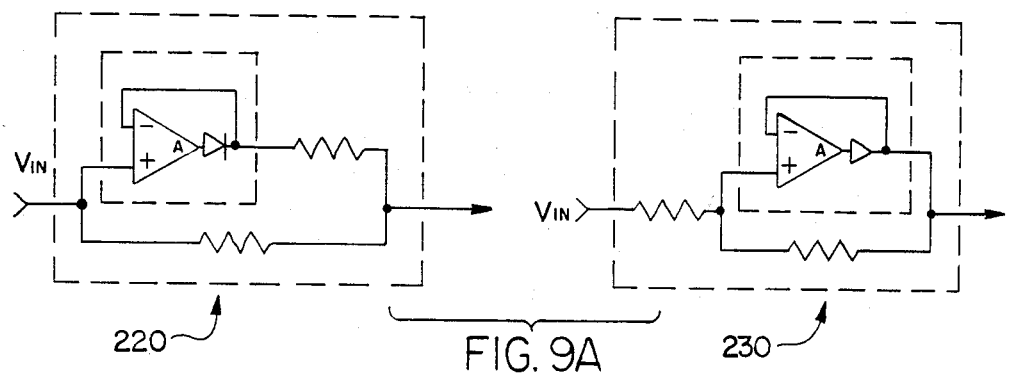

FIG. 9A shows an alternate passive form of unidirectional conductor (e.g., a diode) for those shown in FIGS. 7, 8a and 8b. The conductor is generally indicated at 210.

FIG. 9b illustrates two possible active networks 220 and 230 which make use of operational amplifiers. Either diodes or appropriately biased transistors may be employed within the operational amplifier feedback loop even though only diodes are shown in circuits 220 and 230. Also, any operational amplifier in these circuits connected as a unity-gain noninverting buffer (voltage follower) may be replaced by a single transistor emitter follower stage with only a small loss in accuracy in most cases.

Figure 10:
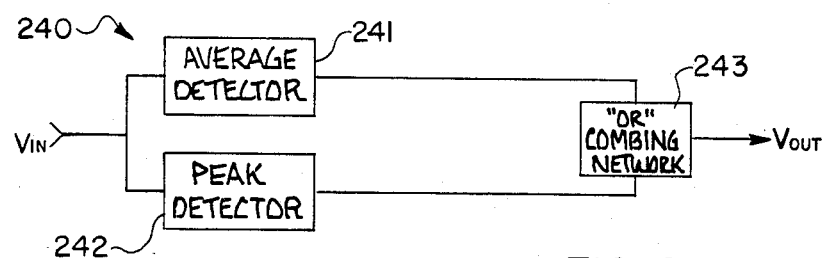
FIG. 10 is a combination detector using a "OR" combining network.

FIG. 10 illustrates a combination detector 240 which employs an average detector 241 and a peak detector 242. Their individual outputs are combined by an analog "OR" (maximum-select) circuit 243 which passes the higher of the two detector signals on to the final output.

Figure 11:
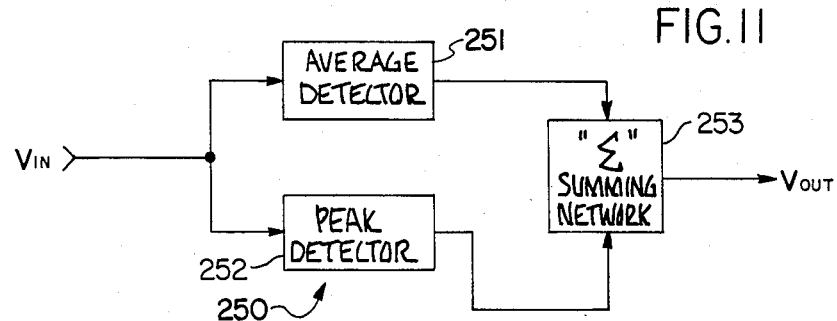
FIG. 11 is a combination detector using a "SUMMING"-type combining network.

FIG. 11 shows a detector network 250 where the individual peak and average detector signals generated in accordance with this invention are combined by a standard linear summing circuit 253 which algebraically adds the two input signals to produce the output signal.

Figure 12:
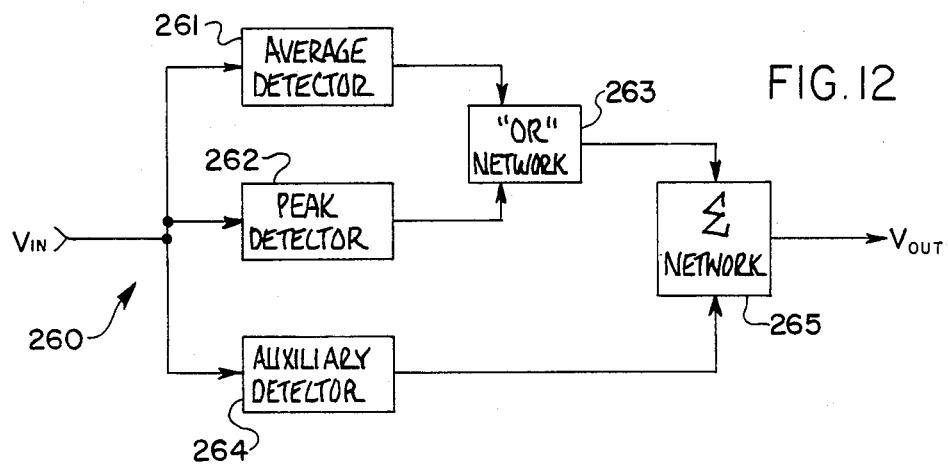
FIG. 12 is a combination detector using both "OR" and "SUMMING"-type combining networks.

FIG. 12 shows a detector network 260 which comprises a combination of the circuits 240 and 250 illustrated in FIGS. 10 and 11, respectively. The output signal from an average detector 261 and a peak detector 262 is processed through an "OR" network 263. Meanwhile, the voltage input signal is also processed through an auxiliary detector 264 either of conventional design (peak, average, RMS, nonlinear, etc.) or of this invention. The output signal from the OR network 263 and the auxiliary detector 264 are summed by a standard linear summing circuit 265. Other combinations may be readily utilized to meet special performance requirements.

Figure 13:
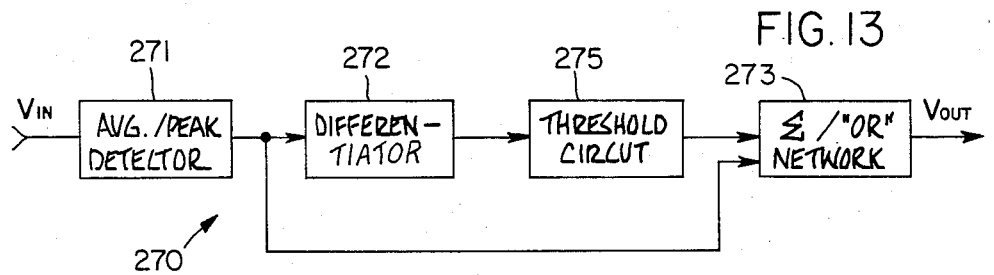
FIG. 13 is a combination detector including a derivative network with a fixed threshhold circuit.
Figure 14:
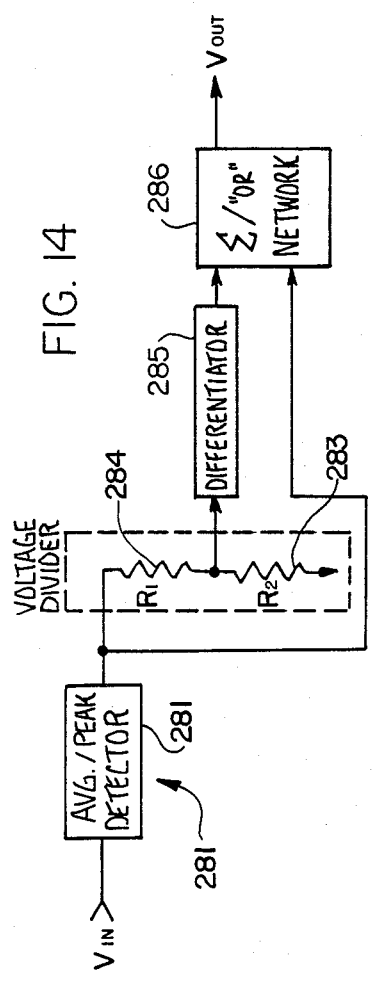
FIG. 14 is a combination detector including a proportional derivative network.

FIG. 13 discloses a combination detector 270 comprised of a detector 271 according to the present invention and a differentiator 272. The differentiator 272 takes the time derivative of the output from detector 271 which is then combined in a summation or an "OR" network 273 to produce a final output signal. A threshold or "dead-band" circuit 275 may be inserted after differentiator 272 to permit the final result to be insensitive to the detector derivative until the derivative signal exceeds a predetermined threshold value. A circuit 280 is shown in FIG. 14 and comprises a variation on circuit 270 shown in FIG. 13. Circuit 280 includes a detector 281 according to the present invention. The output from detector 281 is attenuated by a resistance voltage divider comprising resistors 283 and 284. The attenuated output from resistors 283 and 284 is applied to a differentiator 285. The output of differentiator 285 is applied to either a summing or an "OR" network 286. In addition, an output signal from detector 281 bypasses voltage divider resistors 283 and 284 and differentiator 285 and is applied directly to the summing or "OR"

network 286. The two signals are combined and processed according to the particular type of circuit 286. Both circuits 270 and 280 permit a nonlinear attack characteristic for a device controlled by the output of the circuits since the rate of attack speeds up as the voltage input signal increases.

Figure 15:
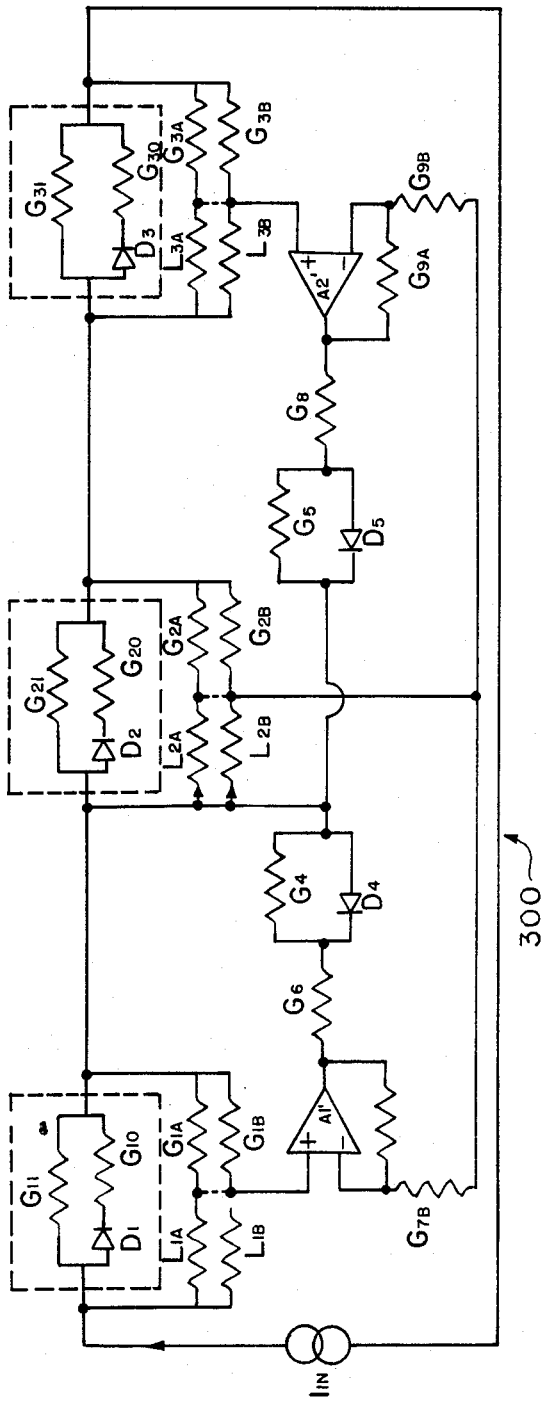

Referring now to FIG. 15, a dual detector circuit 300 is illustrated which is similar in operation to circuit 180 shown in FIG. 8a. Currents are interchanged with voltages. Resistances are interchanged with conductances, and inductors are interchanged with capacitors. Also, parallel circuit branches are interchanged with series branches, and voltage amplifiers with high input and low output impedances, such as operational amplifiers 185 and 186 in FIG. 8a, become current amplifiers with low input and high output impedances in circuit 300.

FIG. 16a shows three alternate forms of passive unidirectional conductors, 310, 320 and 330, which may be used to obtain a variable attack-time feature. FIG. 16b shows corresponding active implementations of unidirectional conductors which are identified as conductors 340, 350 and 360. Conductors 340, 350 and 360 include operational amplifiers 341, 351 and 361, respectively, as voltage followers to enhance diode performance characteristics.

Figure 17:
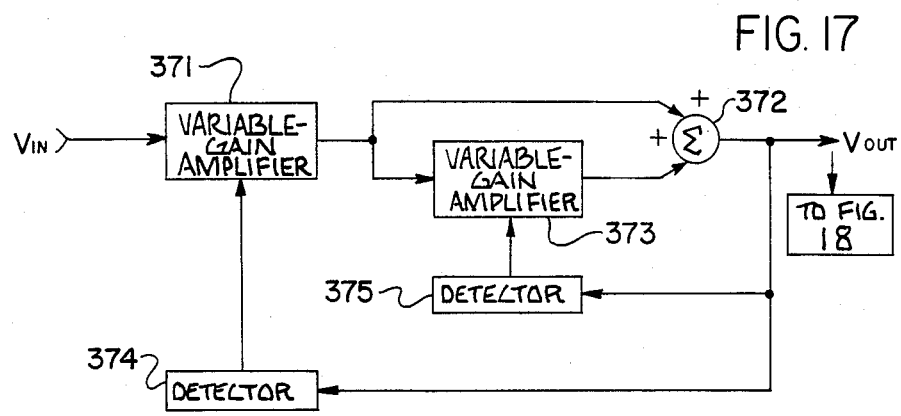
FIG. 17 shows a compressor circuit utilizing detectors according to the present invention.

FIG. 17 illustrates a practical two-stage compressor circuit 370 for audio signal dynamic range reduction. Input signal is transmitted to a variable gain amplifier 371. The output from amplifier 371 is divided with one of the signals going directly to a summing circuit 372 with the other signal passing through another variable gain amplifier 373 where it is combined with the other signal in summing circuit 372. An output signal is generated which is also processed back through detectors 374 and 375 according to the present invention. Detector 374 inputs a signal into amplifier 371 and detector 375 inputs a signal into amplifier 373.

Figure 18:
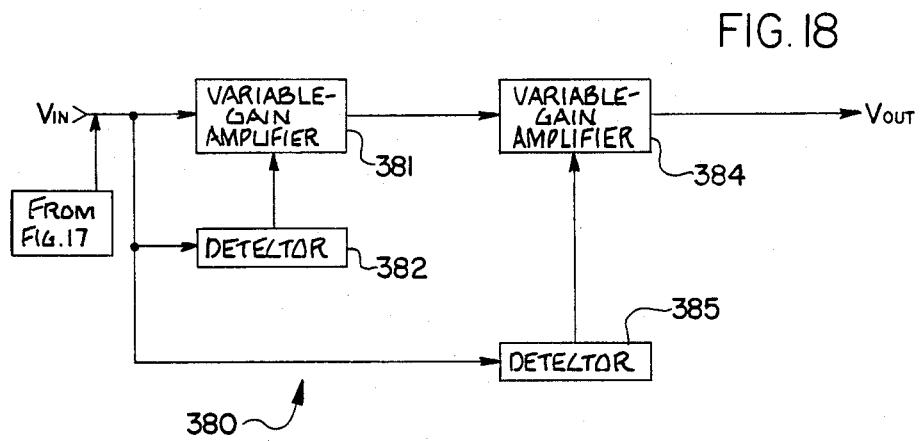
FIG. 18 illustrates an expandor circuit utilizing detectors according to the present invention.

FIG. 18 illustrates an expandor circuit 380 which is analogous to the compressor circuit 370 shown in FIG. 17. A signal inputs directly into a variable gain amplifier 381 and indirectly through a detector 382 according to the present invention. The output from variable gain amplifier 381 is directed into a second variable gain amplifier 384, which also receives as another input a signal from another detector 385 according to the present invention.

Figure 19:
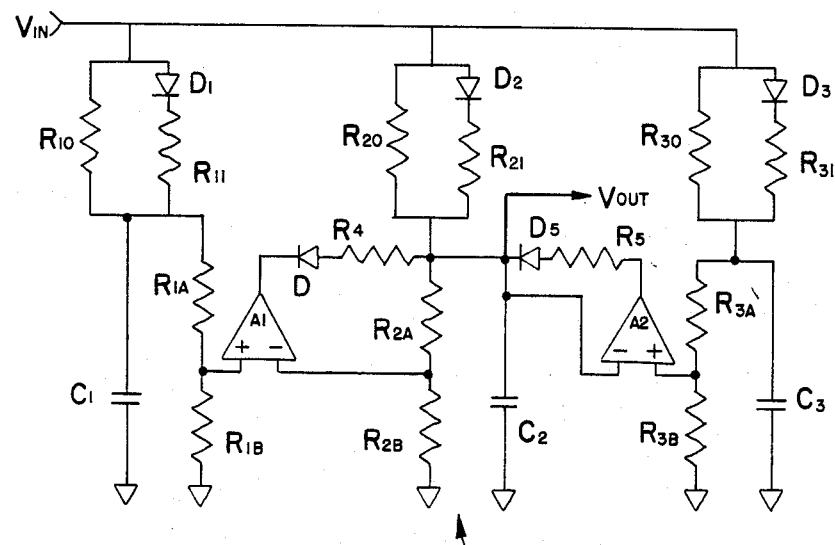
FIG. 19 is a general form of detector of the peak-detection form.

FIG. 19 illustrates a preferred embodiment of a peak-detection form of a detector circuit according to the present invention. This circuit 400 is provided solely to indicate the parts values of one preferred embodiment and hence is provided only with standard electronics notation.

D1–D5=silicon diodes (1N4148 or equiv.)
C1=0.1 $\mu$F; C2=1.0 $\mu$F; C3=0.1 $\mu$F.
$R_{10}=\infty$; $R_{11}=0\Omega$; $R_{20}=\infty$; $R_{21}=1\kappa\Omega$; $R_{30}=\infty$; $R_{31}=0\Omega$.
$R_{14}=2.2\kappa\Omega$; $R_{18}=100\kappa\Omega$; $R_{24}=620\kappa\Omega$; $R_{28}=300\kappa\Omega$; $R_{34}=2.2\kappa\Omega$; $R_{38}=1\kappa\Omega$.
$R_4=47\Omega$; $R_5=47\Omega$.
$A_1,A_2$=LF351 op-amp.

The various embodiments of the invention disclosed above illustrate the wide variety of uses to which the basic invention can be applied. As noted above, the use of an operational amplifier greatly assists in achieving extremely high performance characteristics within the circuits at a very low cost. Operational amplifiers per se are well known and universally utilized linear circuit components which permit much higher circuit performance than with passive components alone. Basically, an operational amplifier imparts to a DC/AC signal gain various desirable properties such as extremely high input impedance and forward (open loop) gain, and very low input currents, offset errors, output impedance, and signal distortion.

In the properties described above, high input impedance and forward gain is ideally infinite. Low input currents, offset errors, output impedance and signal distortion are each ideally zero.

The modern integrated circuit operational amplifier permits the ideal specifications described above to be very closely met at an extremely low cost. Either voltage or current-type feedback can be applied to an operational amplifier to achieve almost any desired transfer function with a minimum number of external parts. The availability of modern inexpensive solid state components in combination with the detector surface disclosed in this application make it possible to achieve extremely high quality noise reduction at a price sufficiently low to permit its inclusion in electronic components in all price ranges of commercial and consumer-oriented equipment.

The invention disclosed herein provides three basic advantages over the prior art. First, a faster basic attack time is possible given equivalent conditions than in prior art circuits. Second, the circuit disclosed in this application delivers a higher detector output voltage since output detector source voltage in prior art devices is attenuated. Third, since the discharge diode may be positioned within the feedback loop of the operational amplifier in the invention according to this application, the hold time of the system is unaffected by the detector level. In prior art devices the hold time and release time each slow down at low detector levels.

Figure 21:
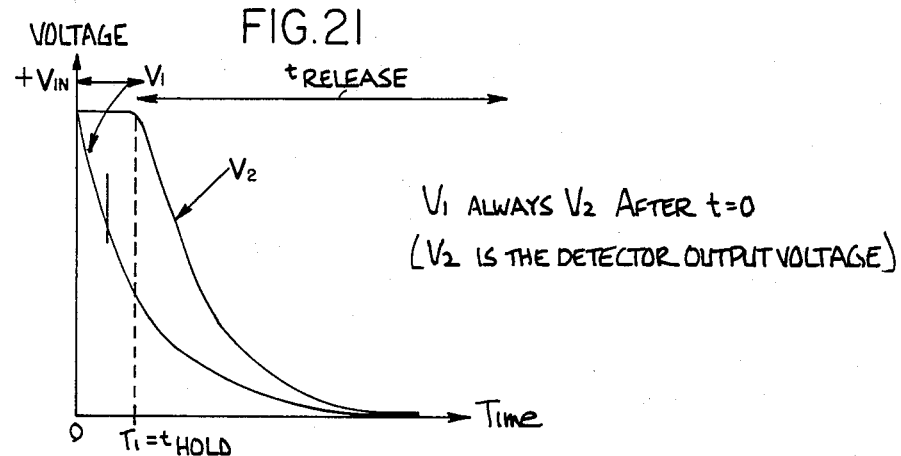

One fundamental difference between this invention and that disclosed in the prior art is illustrated with reference to FIGS. 20 and 21.

Figure 20:
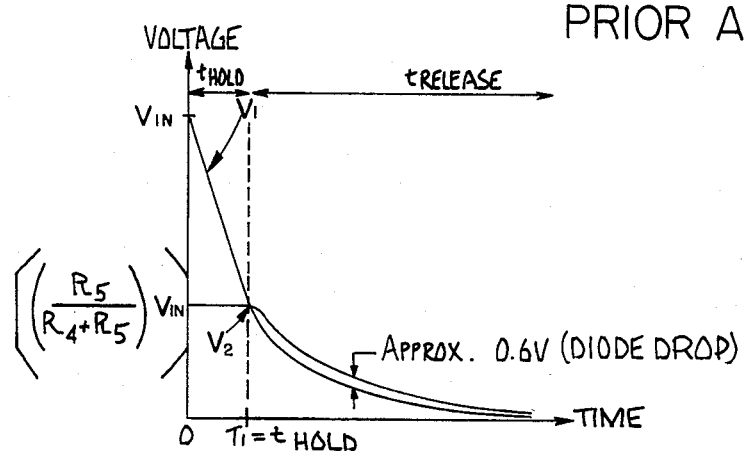
FIG. 20 is a graph illustrating time responses of a detector of the general type shown in FIG. 2; and, FIG. 21 is a graph showing time responses to a detector in accordance with the present invention.

FIG. 20 illustrates the time response of a prior art detector. Note that V1 starts out at a much greater level than V2 and then decays to a level substantially equal to V2 before V2 begins to decay. In contrast, the time response of the detector according to the present invention (FIG. 21) illustrates that V1 and V2 initially are the same voltage, but V1 rapidly decays to a value less than V2 and remains less than V2 for the duration of the hold and release time interval. In fact, V1 is never greater than V2 nor does a first detector ever interact directly with a second detector. Instead, the function of a first detector is to provide a timing control to first disable and later to activate and direct the operation of a discharge amplifier. The amplifier and its associated diode are responsible for an increased rate of decay experienced by the first detector after the hold time has elapsed. These functions are illustrated by comparing the voltage levels at corresponding times in FIG. 20 and FIG. 21.

A circuit detector, and a noise reduction network containing a circuit detector is described above. The teachings of this invention may be incorporated in various combinations to perform desired functions and to achieve desired results. For example, the compressor circuit shown in FIG. 17 can be combined with the expandor circuit shown in FIG. 18 to form a compander. Numerous other combinations are possible. Therefore, various details of the invention may be changed without departing from its scope. Furthermore, the foregoing description of a preferred embodiment of the invention is provided for the purpose of illustration only and not for the purpose of limitation—the invention being defined by the claims.

I claim:

1. A detector responsive to an input primary electrical source signal for controlling the conversion of an AC to a DC signal comprising:
   (a) first memory means for continuously receiving and storing input signals;
   (b) a first directional conducting circuit for providing said input signals to said first memory means, said first directional conducting circuit being connected between a primary input point for receiving said primary electrical source signal and said first memory means and comprising a first unidirectional conductor in electrical parallel arrangement with a first resistive element;
   (c) second memory means for continuously receiving and storing input signals, said second memory means including an output point for providing an output signal representative of the stored signal value of said second memory means;
   (d) a second directional conductor circuit for providing said input signals to said second memory means, said directional conducting circuit for receiving a secondary electrical source signal and being connected between a secondary input point and said second memory means, and comprising a second unidirectional conductor in electrical parallel arrangement with a second resistive element; and,
   (e) an active signal amplifying device and a third unidirectional conductor in electrical series arrangement to provide a dynamically-controlled charge and/or discharge path for said second memory means which is dependent upon the instantaneous voltages on said first and second memory means such that,
   for the discharge case, whenever the stored signal value of said first memory means is at least equal to a prescribed fraction of the stored signal value of the second memory means, the amplifying device produces an output signal such that said third unidirectional conductor does not conduct, and thus the stored signal values of said first and second memory means are essentially independent of each other and vary substantially only in response to changes in said input signals provided to said first and second memory means, respectively, as they discharge according to their respective time constants, and whenever said primary electrical source signal is less than the stored value of said second memory means and said stored value of said first memory means decreases to a value substantially equal to the prescribed fraction of the stored value of said second memory means, which value is greater than the stored value of said first memory means, said amplifying device causes said third unidirectional conductor to conduct and the stored signal values of said first and second memory means vary in a nearly proportional manner and remain substantially proportional to each other by the ratio of the said prescribed fraction as they both discharge according to a combined time constant which is essentially the time constant of said first memory means;
   and for the charging case, whenever the stored signal value of said first memory means is at most equal to the inverse of a prescribed fraction of the stored signal value of the second memory means, the amplifying device produces an output signal such that said third unidirectional conductor, now reversed in orientation from the discharge case, does not conduct, and thus the stored signal values of said first and second memory means are essentially independent of each other and vary substantially only in response to changes in said input signals provided to said first and second memory means, respectively, as they charge or discharge according to the level of their said input signals and their respective time constants, and whenever said primary electrical source signal is greater than the stored value of said second memory means and said stored signal value of said first memory means increases to a value substantially equal to the inverse of the prescribed fraction of the stored value of said second memory means, which value is now less than the stored value of said first memory means by the ratio of the prescribed fraction, said amplifying device causes said third unidirectional conductor to conduct and the stored signal values of said first and second memory means vary in a nearly proportional manner and remain substantially proportional to each other by the ratio of the said prescribed fraction as they both charge according to a combined time constant which is essentially the time constant of said first memory means.

2. The detector of claim 1 and further comprising a third resistive element connected between one of said primary input point and said first unidirectional conductor, and said secondary input point and said second unidirectional conductor.

3. The detector of claim 1 and further comprising a third resistive element connected between said primary input point and said first unidirectional conductor and a fourth resistive element connected between said secondary input point and said second unidirectional conductor.

4. The detector of claim 1 wherein said second directional conducting circuit further comprises a third resistive element in electrical series arrangement with said second unidirectional conductor and said second resistive element is in electrical parallel arrangement with said second unidirectional conductor and said third resistive element.

5. The detector of claim 1 and further comprising a third resistive element connected between said primary input point and said first directional conducting circuit.

6. The detector of claim 1 and further comprising a third resistive element connected between said secondary input point and said second directional conducting circuit.

7. The detector of claim 1 and further comprising a third resistive element connected between said primary input point and said first directional conducting circuit, and a fourth resistive element connected between said secondary input point and said second directional conducting circuit.

8. The detector of claim 1 wherein said first directional conducting circuit further comprises a third resistive element in electrical series arrangement with said first unidirectional conductor, and said first resistive element is in electrical parallel arrangement with said first unidirectional conductor and said third resistive element.

9. The detector of claim 8 wherein said second directional conducting circuit further comprises a fourth resistive element in electrical series arrangement with said second unidirectional conductor and said second resistive element is in electrical parallel arrangement with said second unidirectional conductor and said fourth resistive element.

10. A detector responsive to an input primary electrical source signal for controlling the conversion of an AC to a DC signal comprising:

(a) first memory means for continuously receiving and storing input signals;

(b) a first directional conducting circuit for controlling said input signal to said first memory means, said first directional conducting circuit being connected between a primary input point for receiving said primary electrical source signal and ground and comprising a first unidirectional conductor in electrical series arrangement with a first resistive element;

(c) second memory means for continuously receiving and storing input signals, said second memory means including an output point for providing an output signal representative of the stored value of said second memory means;

(d) a second directional conducting circuit for controlling said input signal to said second memory means, said second directional conducting circuit for receiving a secondary electrical source signal and being connected between a secondary input point and ground, and comprising a second unidirectional conductor in electrical series arrangement with a second resistive element; and, (e) an active signal amplifying device and a third unidirectional conductor for providing interaction between said first and second memory means, one end of said third unidirectional conductor connected to second memory means and the other end being connected to the amplifier output, and the inputs to the amplifying device connected to the said first and second memory means and the amplifier output connected to said third unidirectional conductor and thusly the second memory means such that;

for the discharge case, whenever the stored signal value of the first memory means is at least equal to a prescribed fraction of the stored signal value of the second memory means, the amplifying device produces an output signal such that said third unidirectional conductor does not conduct, and thus the stored signal values of said first and second memory means are essentially independent of each other and vary substantially only in response to changes in said input signals provided to said first and second memory means, respectively, as they discharge according to their respective time constants, and, whenever said primary electrical source signal is less than the stored value of said second memory means, and said stored signal value of said first memory means decreases to a value substantially equal to the prescribed fraction of the stored value of said second memory means, which value is greater than the stored value of said first memory means, said amplifying device causes said third unidirectional conductor to conduct and the stored signal values of said first and second memory means vary in a nearly proportional manner and remain substantially proportional to each other by the ratio of the said prescribed fraction as they both discharge according to a combined time constant which is essentially the time constant of said first memory means;

and for the charging case, whenever the stored signal value of said first memory means is at most equal to the inverse of a prescribed fraction of the stored signal value of the second memory means, the amplifying device produces an output signal such that said third unidirectional conductor, now reversed in orientation from the discharge case, and does not conduct, and thus the stored signal values of said first and second memory means are essentially independent of each other and vary substantially only in response to changes in said input signals provided to said first and second memory means, respectively, as they charge or discharge according to the level of their said input signals and their respective time constants, and whenever said primary electrical source signal is greater than the stored value of said second memory means and said stored signal value of said first memory means increases to a value substantially equal to the inverse of the prescribed fraction of the stored value of said second memory means, which value is now less than the stored value of said first memory means by the ratio of the prescribed fraction, said amplifying device causes said third unidirectional conductor to conduct and the stored signal values of said first and second memory means vary in a nearly proportional manner and remain substantially proportional to each other by the ratio of the said prescribed fraction as they both charge according to a combined time constant which is essentially the time constant of said first memory means.

11. The detector of claims 1, 9 or 10 wherein said primary electrical source signal is a combination of signals from a multiplicity of sources.

12. The detector of claims 1, 9 or 10 wherein one of said first and second memory means includes a capacitive element.

13. The detector of claims 1, 9 or 10 wherein both of said first and second memory means includes a capacitive elements.

14. The detector of claim 1, 9 or 10 and further comprising a first voltage dividing resistive element connected between said primary input point and said secondary input point, and a second voltage dividing resistive element connected between said second input point and ground such that said secondary electrical source signal is proportional to and smaller than said primary electrical source signal.

15. The detector of claims 1, 9 or 10 and further comprising:

(a) means connected to said output point of said detector for providing a time derivative signal representative of the rate of change of the output signal from said detector; and, (b) combining means connected to said output point of said detector and the output of said time derivative means for receiving said detector output signal and said time derivative signal for providing a resultant output signal representative of the combined value of said time derivative signal and said detector output signal.

16. The detector of claim 15 wherein said time derivative means includes a threshold circuit such that said time derivative signal is provided to said combining means only if said time derivative signal exceeds a preselected value.

17. A multistage detector responsive to an input primary electrical source signal for controlling the conversion of AC signals to DC signals comprising:
  (a) a multiplicity of detector stages, at least one stage comprising
  (b) first memory means for continuously receiving and storing input signals;
  (c) a first directional conducting circuit for providing said input signals to said first memory means, said first directional conducting circuit being connected between a primary input point for receiving said primary electrical source signal and said first memory means and comprising a first unidirectional conductor in electrical parallel arrangement with a first resistive element;
  (d) second memory means for continuously receiving and storing input signals, said second memory means including an output point for providing an output signal representative of the stored signal value of said second memory means;
  (e) a second directional conducting circuit for providing said input signals to said second memory means, said second directional conducting circuit for receiving a secondary electrical source signal and being connected between a secondary input point and said second memory means, and comprising a second unidirectional conductor in electrical parallel arrangement with a second resistive element; and,
  (f) an active signal amplifying device and a third unidirectional conductor in electrical series arrangement to provide a dynamically-controlled charge and/or discharge path for said second memory means which is dependent upon the instantaneous voltages on said first and second memory means such that,
  for the discharge case, whenever the stored signal value of said first memory means is at least equal to a prescribed fraction of the stored signal value of the second memory means, the amplifying device produces an output signal such that said third unidirectional conductor does not conduct, and thus the stored signal values of said first and second memory means are essentially independent of each other and vary substantially only in response to changes in said input signals provided to said first and second memory means, respectively, as they discharge according to their respective time constants, and whenever said primary electrical source signal is less than the stored value of said second memory means and said stored value of said first memory means decreases to a value substantially equal to the prescribed fraction of the stored value of said second memory means, which value is greater than the stored value of said first memory means, said amplifying device causes said third unidirectional conductor to conduct and the stored signal values of said first and second memory means vary in a nearly proportional manner and remain substantially proportional to each other by the ratio of the said prescribed fraction as they both discharge according to a combined time constant which is essentially the time constant of said first memory means;
  and for the charging case, whenever the stored signal value of said first memory means is at most equal to the inverse of a prescribed fraction of the stored signal value of the second memory means, the amplifying device produces an output signal such that said third unidirectional conductor, now reversed in orientation from the discharge case, does not conduct, and thus the stored signal values of said first and second memory means are essentially independent of each other and vary substantially only in response to changes in said input signals provided to said first and second memory means, respectively, as they charge or discharge according to the level of their said input signals and their respective time constants, and whenever said primary electrical source signal is greater than the stored value of said second memory means and said stored signal value of said first memory means increases to a value substantially equal to the inverse of the prescribed fraction of the stored value of said second memory means, which value is now less than the stored value of said first memory means by the ratio of the prescribed fraction, said amplifying device causes said third unidirectional conductor to conduct and the stored signal values of said first and second memory means vary in a nearly proportional manner and remain substantially proportional to each other by the ratio of the said prescribed fraction as they both charge according to a combined time constant which is essentially the time constant of said first memory means; and,
  (g) combining means connected to the output point of each of said detector stages for receiving said output signals and for providing a resultant output signal representative of the combined output signals.

18. A multistage detector responsive to an input primary electrical source signal for controlling the conversion of an AC signal to a DC signal comprising:
  (a) a multiplicity of detector stages, at least one stage comprising:
  (b) first memory means for continuously receiving and storing input signals;
  (c) a first directional conducting circuit for controlling said input signal to said first memory means, said first directional conducting circuit being connected between a primary input point for receiving said primary electrical source signal and ground and comprising a first unidirectional conductor in electrical series arrangement with a first resistive element;
  (d) second memory means for continuously receiving and storing input signal said second memory means including an output point for providing an output signal representative of the stored value of said second memory means;
  (e) a second directional conducting circuit for controlling said input signal to said second memory means, said second directional conducting circuit for receiving a secondary electrical source signal and being connected between a secondary input point and ground, and comprising a second unidirectional conductor in electrical series arrangement with a second resistive element, (f) an active signal amplifying device and a third unidirectional conductor for providing interaction between said first and second memory means, one end of said third unidirectional conductor connected to second memory means and the other end being connected to the amplifier output, and the inputs to the amplifying device connected to the said first and second memory means and the amplifier output connected to said third unidirectional conductor and thusly the second memory means such that;

for the discharge case, whenever the stored signal value of the first memory means is at least equal to a prescribed fraction of the stored signal value of the second memory means, the amplifying device produces an output signal such that said third unidirectional conductor does not conduct, and thus the stored signal values of said first and second memory means are essentially independent of each other and vary substantially only in response to changes in said input signals provided to said first and second memory means, respectively, as they discharge according to their respective time constants, and, whenever said primary electrical source signal is less than the stored value of said second memory means, and said stored signal value of said first memory means decreases to a value substantially equal to the prescribed fraction of the stored value of said second memory means, which value is greater than the stored value of said first memory means, said amplifying device causes said third unidirectional conductor to conduct and the stored signal values of said first and second memory means vary in a nearly proportional manner and remain substantially proportional to each other by the ratio of the said prescribed fraction as they both discharge according to a combined time constant and for the charging case, whenever the stored signal value of said first memory means is at most equal to the inverse of a prescribed fraction of the stored signal value of the second memory means, the amplifying device produces an output signal such that said third unidirectional conductor is now reversed in orientation from the discharge case and does not conduct, and thus the stored signal values of said first and second memory means are essentially independent of each other and vary substantially only in response to changes in said input signals provided to said first and second memory means, respectively, as they charge or discharge according to the level of their said input signals and their respective time constants, and whenever said primary electrical source signal is greater than the stored value of said second memory means and said stored signal value of said first memory means increases to a value substantially equal to the inverse of the prescribed fraction of the stored value of said second memory means which value is now less than the stored value of said first memory means by the ratio of the prescribed fraction, said amplifying device causes said third unidirectional conductor to conduct and the stored signal values of said first and second memory means vary in a nearly proportional manner and remain substantially proportional to each other by the ratio of the said prescribed fraction as they both charge according to a combined time constant which is essentially the time constant of said first memory means; and (g) combining means connected to the output point of each of said detector stages for receiving said output signals and for providing a resultant output signal representative of the combined output signals.

19. The multistage detector of claim 17 or 18 wherein said combining means is an analog "OR" circuit.

20. The multistage detector of claim 17 or 18 wherein said combining means is a summation circuit.

21. The multistage detector of claim 17 or 18 wherein at least one of said stages is an averaging detector responsive to a selected averaged value of the of the primary electrical source signal, and at least one of the detector stages is responsive to the instantaneous peak value of the primary electrical source signal.

22. Circuitry for compressing the dynamic range of an electrical intelligence signal comprising:

(a) a variable gain amplifier responsive to a control signal, said variable gain amplifier having a compressor circuit input for receiving an electrical intelligence signal and a compressor circuit output for providing a primary electrical source signal with a compressed dynamic range;

(b) a detector responsive to said primary electrical source signal for providing said control signal to control said variable gain amplifier comprising first memory means for continuously receiving and storing input signals (c) a first directional conducting circuit for providing said input signal to said first memory means, said first directional conducting circuit–for- receiving said primary electrical source signal and being conducted between said compressor circuit output and said first memory means and comprising a first unidirectional conductor in electrical parallel arrangement with a first resistive element, (d) second memory means for continuously receiving and storing input signals, said second memory means including an output point for providing said control signal representative of the stored signal value of said second memory means;

(e) a second directional conductor circuit for providing said input signals to said second memory means, said second directional conducting circuit for receiving a secondary electrical source signal and being connected between a secondary input point and said second memory means, and comprising a second unidirectional conductor in electrical parallel arrangement with a second resistive element;

(f) means for providing said secondary electrical source signal to said secondary input point, said secondary source signal being proportional to said primary electrical source signal; and, (g) an active signal amplifying device and a third unidirectional conductor in electrical series arrangement to provide a dynamically-controlled charge and/or discharge path for said second memory means which is dependent upon the instantaneous voltages on said first and second memory means such that, for the discharge case, whenever the stored signal value of said first memory means is at least equal to a prescribed fraction of the stored signal value of the second memory means, the amplifying device produces an output signal such that said third unidirectional conductor does not conduct, and thus the stored signal values of said first and second memory means are essentially independent of each other and vary substantially only in response to changes in said input signals provided to said first and second memory means, respectively, as they discharge according to their respective time constants, and whenever said primary electrical source signal is less than the stored value of said second memory means and said stored value of said first memory means decreases to a value substantially equal to the prescribed fraction of the stored value of said second memory means, which value is greater than the stored value of said first memory means, said amplifying device causes said third unidirectional conductor to conduct and the stored signal values of said first and second memory means vary in a nearly proportional manner and remain substantially proportional to each other by the ratio of the said prescribed fraction as they both discharge according to a combined time constant which is essentially the time constant of said first memory means;

and for the charging case, whenever the stored signal value of said first memory means is at most equal to the inverse of a prescribed fraction of the stored signal value of the second memory means, the amplifying device produces an output signal such that said third unidirectional conductor is now reversed in orientation from the discharge case and does not conduct, and thus the stored signal values of said first and second memory means are essentially independent of each other and vary substantially only in response to changes in said input signals provided to said first and second memory means, respectively, as they charge or discharge according to the level of their said input signals and their respective time constants, and whenever said primary electrical source signal is greater than the stored value of said second memory means and said stored signal value of said first memory means increases to a value substantially equal to the inverse of the prescribed fraction of the stored value of said second memory means which value is now less than the stored value of said first memory means by the ratio of the prescribed fraction, said amplifying device causes said third unidirectional conductor to conduct and the stored signal values of said first and second memory means vary in a nearly proportional manner and remain substantially proportional to each other by the ratio of the said prescribed fraction as they both charge according to a combined time constant which is essentially the time constant of said first memory means.

23. Circuitry for expanding the dynamic range of an electrical intelligence signal comprising:
(a) a variable gain amplifier responsive to a control signal, said variable gain amplifier having an expander circuit input for receiving an electrical intelligence signal and an expander circuit output for providing a primary electrical source signal with an expanded dynamic range;
(b) a detector responsive to said electrical intelligence signal for providing said control signals to control said variable gain amplifier comprising: first memory means for continuously receiving and storing input signals;
(c) a first directional conducting circuit for providing said input signals to said first memory means, said first directional conducting circuit for receiving said electrical intelligence signal and being connected between said expander circuit input and said first memory means and comprising a first unidirectional conductor in electrical parallel arrangement with a first resistive element;
(d) a secondary memory means for continuously receiving and storing input signals, said second memory means including an output point for providing said control signal representative of the stored signal value of said second memory means;
(e) second directional conductor circuit for providing said input signals to said second memory means, said second directional conducting circuit for receiving a modified electrical intelligence signal and being connected between a secondary input point and said second memory means, and comprising a second unidirectional conductor in electrical parallel arrangement with a second resistive element;
(f) means for providing said modified electrical intelligence signal to said secondary input point, said modified electrical intelligence signal being proportional to said electrical intelligence signal; and,
(g) an active signal amplifying device and a third unidirectional conductor in electrical series arrangement to provide a dynamically-controlled charge and/or discharge path for said second memory means which is dependent upon the instantaneous voltages on said first and second memory means such that, for the discharge case, whenever the stored signal value of said first memory means is at least equal to a prescribed fraction of the stored signal value of the second memory means, the amplifying device produces an output signal such that said third unidirectional conductor does not conduct, and thus the stored signal values of said first and second memory means are essentially independent of each other and vary substantially only in response to changes in said input signals provided to said first and second memory means, respectively, as they discharge according to their respective time constants, and whenever said primary electrical source signal is less than the stored value of said second memory means and said stored value of said first memory means decreases to a value substantially equal to the prescribed fraction of the stored value of said second memory means, which value is greater than the stored value of said first memory means, said amplifying device causes said third unidirectional conductor to conduct and the stored signal values of said first and second memory means vary in a nearly proportional manner and remain substantially proportional to each other by the ratio of the said prescribed fraction as they both discharge according to a combined time constant which is essentially the time constant of said first memory means;

and for the charging case, whenever the stored signal value of said first memory means is at most equal to the inverse of a prescribed fraction of the stored signal value of the second memory means, the amplifying device produces an output signal such that said third unidirectional conductor is now reversed in orientation from the discharge case and does not conduct, and thus the stored signal values of said first and second memory means are essentially independent of each other and vary substantially only in response to changes in said input signals provided to said first and second memory means, respectively, as they charge or discharge according to the level of their said input signals and their respective time constants, and whenever said primary electrical source signal is greater than the stored value of said second memory means and said stored signal value of said first memory means increases to a value substantially equal to the inverse of the prescribed fraction of the stored value of said second memory means which value is now less than the stored value of said first memory means by the ratio of the prescribed fraction, said amplifying device causes said third unidirectional conductor to conduct and the stored signal values of said first and second memory means vary in a nearly proportional manner and remain substantially proportional to each other by the ratio of the said prescribed fraction as they both charge according to a combined time constant which is essentially the time constant of said first memory means.

24. A compander circuit for compressing and expanding the dynamic range of an electrical intelligence signal comprising:
 (a) first variable gain amplifier responsive to a first control signal, said first variable gain amplifier having a compressor input point for receiving an electrical intelligence signal and a compressor circuit output for providing a first primary electrical source signal with a compressed dynamic range;
 (b) a first detector responsive to said first primary electrical source signal for providing said first control signal to control said first variable gain amplifier, said first detector comprising,
 (c) first memory means for continuously receiving and storing input signals;
 (d) a first directional conducting circuit for providing said input signals to said first memory means, said first directional conducting circuit for receiving said first primary electrical source signal and being connected between said compressor circuit output and said first memory means and comprising a first unidirectional conductor in electrical parallel arrangement with a first resistive element;
 (e) second memory means for continuously receiving and storing input signals, said second memory means including means for providing said first control signal representative of the stored signal value of said second memory means;
 (f) a second directional conductor circuit for providing said input signals to said second memory means, said second directional conducting circuit for receiving a first secondary electrical source signal and being connected between a first secondary input point and said second memory means, and comprising a second unidirectional conductor in electrical parallel arrangement with a second resistive element;
 (g) means for providing said first secondary electrical source signal to said first secondary input point, said first secondary source signal being proportional to said first primary electrical source signal;
 (h) an active signal amplifying device and a third unidirectional conductor in electrical series arrangement to provide a dynamically-controlled charge and/or discharge path for said second memory means which is dependent upon the instantaneous voltages on said first and second memory means such that,
 for the discharge case, whenever the stored signal value of said first memory means is at least equal to a prescribed fraction of the stored signal value of the second memory means, the amplifying device produces an output signal such that said third unidirectional conductor does not conduct, and thus the stored signal values of said first and second memory means are essentially independent of each other and vary substantially only in response to changes in said input signals provided to said first and second memory means, respectively, as they discharge according to their respective time constants, and whenever said primary electrical source signal is less than the stored value of said second memory means and said stored value of said first memory means decreases to a value substantially equal to the prescribed fraction of the stored value of said second memory means, which value is greater than the stored value of said first memory means, said amplifying device causes said third unidirectional conductor to conduct and the stored signal values of said first and second memory means vary in a nearly proportional manner and remain substantially proportional to each other by the ratio of the said prescribed fraction as they both discharge according to a combined time constant which is essentially the time constant of said first memory means;
 and for the charging case, whenever the stored signal value of said first memory means is at most equal to the inverse of a prescribed fraction of the stored signal value of the second memory means, the amplifying device produces an output signal such that said third unidirectional conductor is now reversed in orientation from the discharge case and does not conduct, and thus the stored signal values of said first and second memory means are essentially independent of each other and vary substantially only in response to changes in said input signals provided to said first and second memory means, respectively, as they charge or discharge according to the level of their said input signals and their respective time constants, and whenever said primary electrical source signal is greater than the stored value of said second memory means and said stored signal value of said first memory means increases to a value substantially equal to the inverse of the prescribed fraction of the stored value of said second memory means which value is now less than the stored value of said first memory means by the ratio of the prescribed fraction, said amplifying device causes said third unidirectional conductor to conduct and the stored signal values of said first and second memory means vary in a nearly proportional manner and remain substantially proportional to each other by the ratio of the said prescribed fraction as they both charge according to a combined time constant which is essentially the time constant of said first memory means;
 (i) a second variable gain amplifier responsive to a second control signal, said second variable gain amplifier having an expander input point for receiving said first primary electrical source signal and an expander circuit output for providing a second primary electrical source signal with an expanded dynamic range;

(j) a second detector responsive to said first primary electrical source signal for providing said second control signal to control said second variable gain amplifier, said second detector comprising:

(k) third memory means for continuously receiving and storing input signals;

(l) a third directional conducting circuit for providing said input signals to said third memory means, said third directional conducting circuit for receiving said first primary electrical source signal and being connected between said expander circuit input and said third memory means and comprising a fourth unidirectional conductor in electrical parallel arrangement with a third resistive element, fourth memory means for continuously receiving and storing input signals, said fourth memory means including means for providing said second control signal representative of the stored signal value of said fourth memory means;

(m) a fourth directional conductor circuit for providing said input signals to said fourth memory means, said fourth directional conducting circuit for receiving a second secondary electrical source signal and being connected between a second secondary input point and said second memory means, and comprising a fifth unidirectional conductor in electrical parallel arrangement with a fourth resistive element;

(n) means for providing said second secondary electrical source signal to said second secondary input point, said second secondary source signal being proportional to said first primary electrical source signal; and, (o) an active signal amplifying device and a sixth unidirectional conductor in electrical series arrangement to provide a dynamically-controlled charge and/or discharge path for said fourth memory means which is dependent upon the instantaneous voltages on said third and fourth memory means such that, for the discharge case, whenever the stored signal value of said third memory means is at least equal to a prescribed fraction of the stored signal value of the fourth memory means, the amplifying device produces an output signal such that said sixth unidirectional conductor does not conduct, and thus the stored signal values of said third and fourth memory means are essentially independent of each other and vary substantially only in response to changes in said input signals provided to said third and fourth memory means, respectively, as they discharge according to their respective time constants, and whenever said primary electrical source signal is less than the stored value of said fourth memory means and said stored value of said third memory means decreases to a value substantially equal to the prescribed fraction of the stored value of said fourth memory means, which value is greater than the stored value of said third memory means, said amplifying device causes said sixth unidirectional conductor to conduct and the stored signal values of said third and fourth memory means vary in a nearly proportional manner and remain substantially proportional to each other by the ratio of the said prescribed fraction as they both discharge according to a combined time constant which is essentially the time constant of said third memory means;

and for the charging case, whenever the stored signal value of said third memory means is at most equal to the inverse of a prescribed fraction of the stored signal value of the fourth memory means, the amplifying device produces an output signal such that said sixth unidirectional conductor is now reversed in orientation from the discharge case and does not conduct, and thus the stored signal values of said third and fourth memory means are essentially independent of each other and vary substantially only in response to changes in said input signals provided to said third and fourth memory means, respectively, as they charge or discharge according to the level of their said input signals and their respective time constants, and whenever said primary electrical source signal is greater than the stored value of said fourth memory means and said stored signal value of said third memory means increases to a value substantially equal to the inverse of the prescribed fraction of the stored value of said fourth memory means which value is now less than the stored value of said third memory means by the ratio of the prescribed fraction, said amplifying device causes said sixth unidirectional conductor to conduct and the stored signal values of said third and fourth memory means vary in a nearly proportional manner and remain substantially proportional to each other by the ratio of the said prescribed fraction as they both charge according to a combined time constant which is essentially the time constant of said third memory means.

* * * * *